United States Patent
Lu

(10) Patent No.: US 12,448,827 B2
(45) Date of Patent: Oct. 21, 2025

(54) RETENTION ASSEMBLY AND CHASSIS HAVING THE SAME

(71) Applicant: Fulian Precision Electronics (Tianjin) Co., LTD., Tianjin (CN)

(72) Inventor: Wen-Hu Lu, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 171 days.

(21) Appl. No.: 18/230,725

(22) Filed: Aug. 7, 2023

(65) Prior Publication Data

US 2025/0012123 A1    Jan. 9, 2025

(30) Foreign Application Priority Data

Jul. 4, 2023 (CN) .......................... 202321741570.7

(51) Int. Cl.
*E05C 19/04* (2006.01)
*H05K 7/14* (2006.01)

(52) U.S. Cl.
CPC ............ *E05C 19/04* (2013.01); *H05K 7/1489* (2013.01)

(58) Field of Classification Search
CPC .. E05B 17/005; E05B 15/0053; E05B 15/006; H05R 13/05; H05R 13/15; H05K 7/1489; E05C 19/00; E05C 19/02; E05C 19/04
USPC .......................................................... 292/75
See application file for complete search history.

(56) References Cited

U.S. PATENT DOCUMENTS

| 1,514,845 | A | * | 11/1924 | Fischer | ................... | E05C 19/04 16/85 |
| 2,439,057 | A | * | 4/1948 | Russell | ................... | E05C 19/04 292/183 |
| 2,553,013 | A | * | 5/1951 | Sciuto | .................... | E05D 13/06 49/420 |
| 7,111,360 | B1 | * | 9/2006 | Hsu | ......................... | E05C 19/04 16/83 |
| 9,228,387 | B2 | * | 1/2016 | Header | ...................... | E05F 5/02 |
| 10,077,589 | B2 | * | 9/2018 | Header | ................... | E05C 17/46 |
| 2011/0119865 | A1 | * | 5/2011 | Vigeh | ....................... | B64C 1/14 29/525.11 |
| 2019/0131728 | A1 | * | 5/2019 | Mardi | .................... | H01R 24/50 |

* cited by examiner

*Primary Examiner* — Nathan Cumar
(74) *Attorney, Agent, or Firm* — ScienBiziP, P.C.

(57) ABSTRACT

A retention assembly for positioning a mounting component slidably arranged on a frame, the retention assembly includes a detent cylinder defining a receiving hole therethrough, a cap covering the receiving hole, and a retention ball and an elastic member located in the receiving hole, the elastic member is arranged between the retention ball and the cap for pressing the retention ball to protrude from the receiving hole and insert into a positioning hole of the mounting component when the positioning hole is aligned with the retention ball. The retention assembly improves convenience of positioning the mounting component relative to the frame and the convenience of maintenance on the electronic components mounted on the mounting component. A chassis including the retention assembly is also provided.

11 Claims, 7 Drawing Sheets

RETENTION ASSEMBLY AND CHASSIS HAVING THE SAME

FIELD

The subject matter relates to electronic device technologies, and more particularly to a retention assembly and a chassis including the retention assembly.

BACKGROUND

In current computers and servers, electronic components such as motherboards, hard drives, and memory are generally fixed to the chassis of the case through mounting components such as mounting trays. When maintenance is required on these electronic components, the chassis needs to be opened to access them, which makes maintenance operations very inconvenient. If the mounting components are slidably set on the chassis of the case, it becomes difficult to control their position relative to the chassis. When the mounting components are slid out from the chassis by a small distance, the electronic components mounted on them may not be fully exposed. On the other hand, if the mounting components are slid out too far, the connecting wires between the electronic components and other parts may be pulled and damaged. Additionally, during maintenance of the electronic components, accidental touching the mounting components may cause them to slide, affecting the normal maintenance operations on the electronic components.

Therefore, there is room for improvement within the art.

BRIEF DESCRIPTION OF THE DRAWINGS

Implementations of the present technology will now be described, by way of example only, with reference to the attached figures.

DETAILED DESCRIPTION

Figure 1:
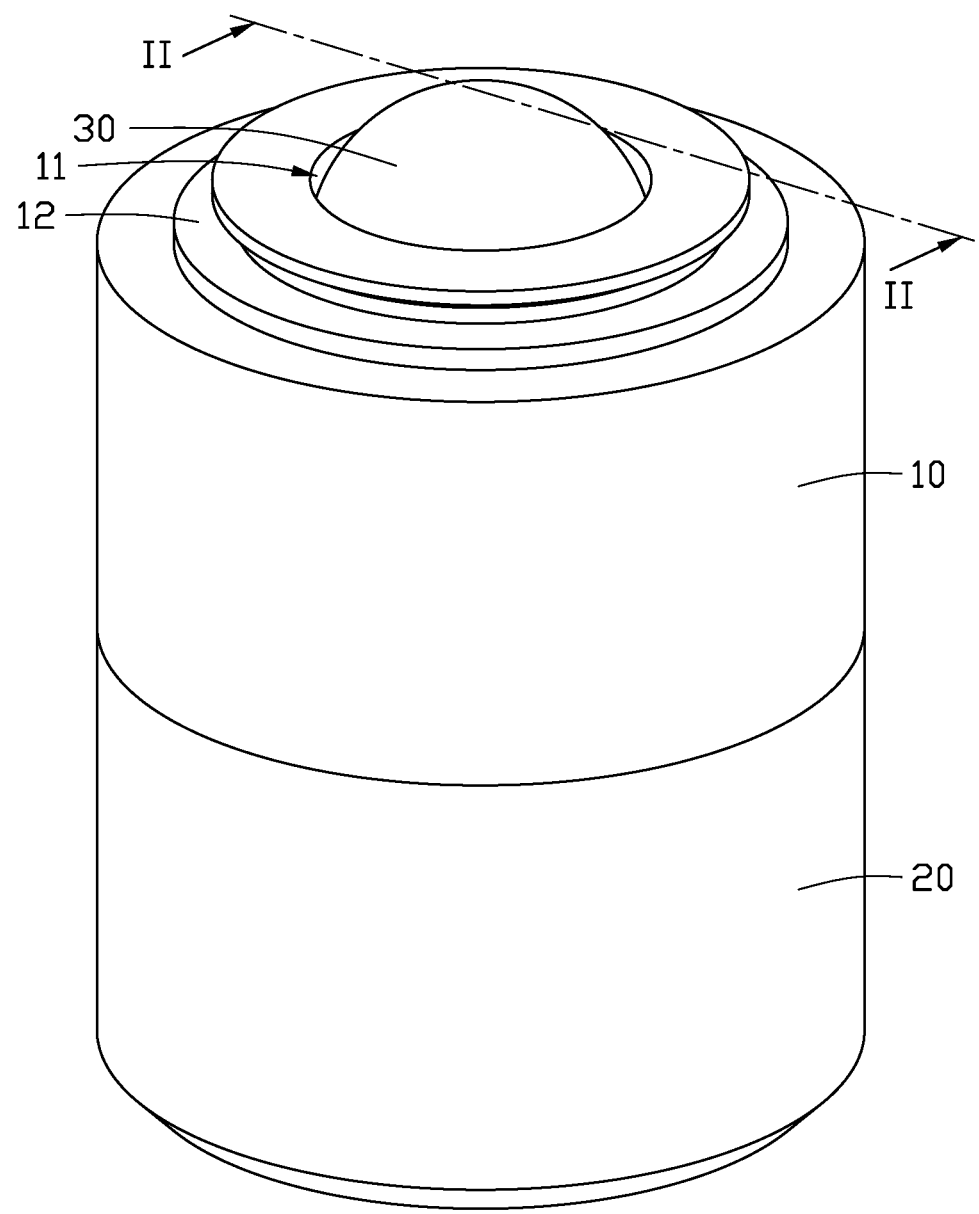
FIG. 1 is a perspective view of a retention assembly according to an embodiment of the disclosure.

It will be appreciated that for simplicity and clarity of illustration, where appropriate, reference numerals have been repeated among the different figures to indicate corresponding or analogous components. The description is not to be considered as limiting the scope of the embodiments described herein. The drawings are not necessarily to scale and the proportions of certain parts may be exaggerated to better illustrate details and features of the disclosure.

It should be understood that, the terms "first" and "second" are used to distinguish between elements and are not used to denote a particular order or imply a number of technical features, therefore, unless specifically defined, features described as "first" and "second" may expressly or implicitly include one or more of the stated features. In the description of the disclosure, "plurality" means "two or more", unless otherwise expressly and specifically defined.

In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described.

The term "comprising," when utilized, means "including, but not necessarily limited to"; it specifically indicates open-ended inclusion or membership in the so-described combination, group, series, and the like.

A description of the hereinafter described embodiments of the disclosure is presented herein with reference to the figures by way of exemplification and not as limitation.

Figure 2:
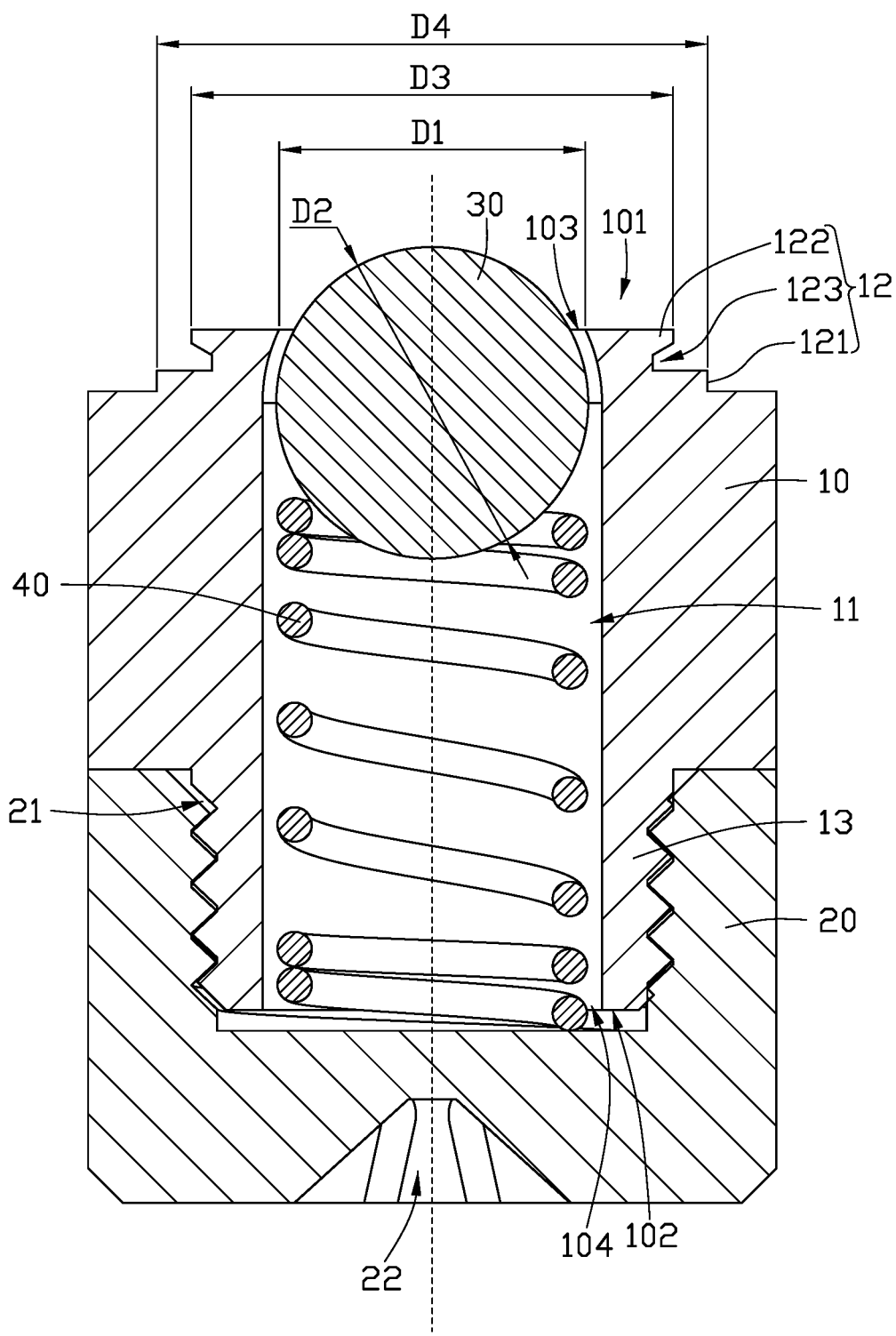
FIG. 2 is a cross section view of the retention assembly in FIG. 1 along II-II.

Referring to FIG. 1 and FIG. 2, a retention assembly 100 is provided. The retention assembly 100 includes a detent cylinder 10, a cap 20, a retention ball 30, and an elastic member 40.

Figure 5:
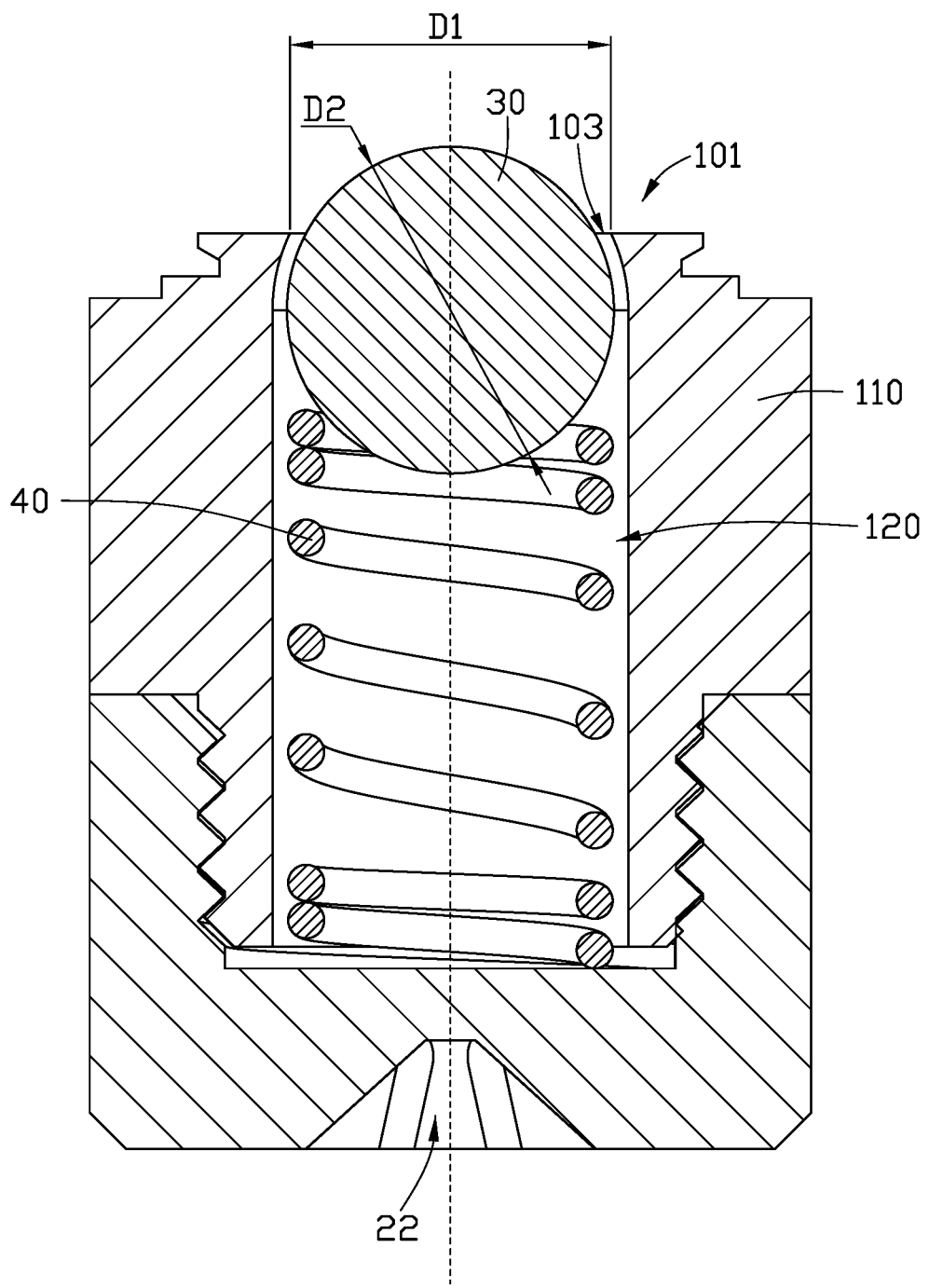
FIG. 5 is a cross section view of a retention assembly according to another embodiment.
Figure 6:
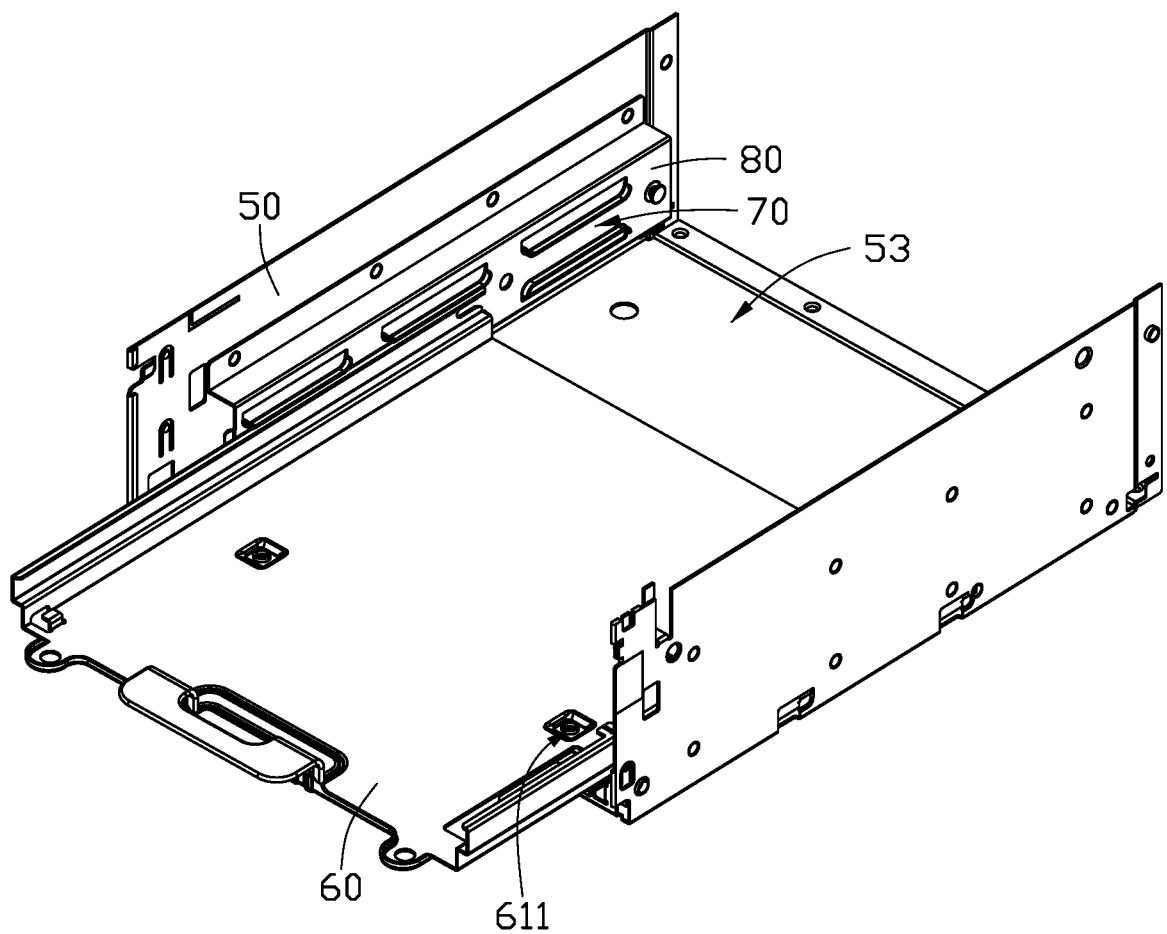
FIG. 6 is a perspective view of a chassis according to an embodiment of the disclosure.

Referring to FIG. 1, FIG. 5, and FIG. 6. The retention assembly 100 is used to position a mounting component 60 that are slidably arranged on a frame 50. The frame 50 can be the frame of a server or computer case 100, and the mounting component 60 is used to support electronic components such as motherboards, blade storage, and graphics cards. For the purpose of illustration and understanding, the embodiment of the disclosure takes the frame 50 of a chassis 100 of a server as an example, with the motherboard as the electronic component. However, this is not intended to limit the embodiment of the disclosure.

Referring to FIG. 1, FIG. 2, FIG. 4, and FIG. 6, the detent cylinder 10 defines a receiving hole 11 through the detent cylinder 10, the receiving hole 11 extends from a first end 101 of the detent cylinder 10 to a second end 102 of the detent cylinder 10, defining a first opening 103 at the first end 101 and a second opening 104 at the second end 102. The diameter of the receiving hole 11 at a portion near the first end 101 gradually decreases towards the first opening 103, such that the first opening 103 has a diameter D2 smaller than the second opening 104. The first end 101 of the detent cylinder 10 is provided with a protrusion 12 surrounding the opening 103, and the protrusion 12 is used for riveting with the frame 50 to improve the convenience of connection with the frame 50.

The cap 20 is connected to the second end 102 of the detent cylinder 10 for enclosing the receiving hole 11.

The retention ball 30 and the elastic member 40 are positioned in the receiving hole 11. In this embodiment, the elastic member 40 is shown as a spring, and the elastic member 40 is arranged between the retention ball 30 and the cap 20 for pressing the retention ball 30 towards the first opening 103. The diameter D1 of the retention ball 30 is larger than the diameter D2 of the first opening 103, thus part of the retention ball 30 protrudes from the receiving hole 11 for contacting with the mounting trays 60.

In specific, one end of the elastic member 40 abuts against the retention ball 30, and the other end of the elastic member 40 abuts against the cap 20. The elastic member 40 is used to support the retention ball 30 and press the retention ball 30 to protrude from the receiving hole 11 to contact with the mounting component 60. The mounting component 60 slides relative to the frame 50, and the elastic member 40 push the retention ball 30 into a positioning hole 611 in the mounting component 60 when the positioning holes 611 align with the retention ball 30, thereby positioning the mounting component 60 relative to the frame 50. This improves the convenience of positioning the mounting component 60 relative to the frame 50.

Figure 4:
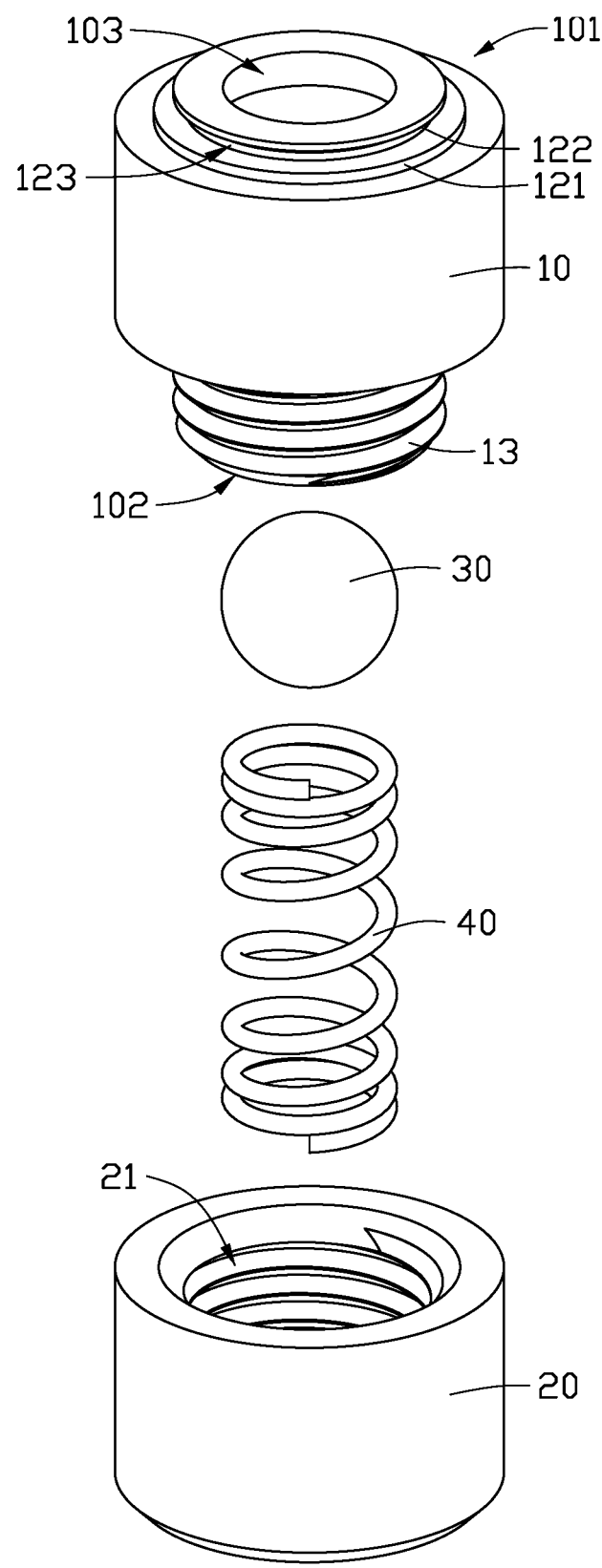
FIG. 4 is an explosive view of the retention assembly in FIG. 1.

Referring to FIG. 2, FIG. 4, and FIG. 6, in this embodiment, the protrusion 12 includes a first annular step 121 and a second annular step 122. The first annular step 121 is protruded from the first end 103 of the detent cylinder 10, the second annular step 122 is protruded from the first annular step 121. The first annular step 121 and the second annular step 122 are used to insert into and tightly fit with the frame 50. An inclined slot 123 is defined between the second annular step 122 and the first annular step 121, the inclined slot 123 is used for engaging with the frame 50.

Specifically, the first annular step 121 and the second annular step 122 are centered with the receiving hole 11. The first annular step 121 has a diameter D4 slightly larger than the diameter of a mounting hole 5121 in the frame 50, and the second annular step 122 has a diameter D3 approximately the same as the diameter of the mounting hole 5121. The inclined slot 123 concaves from outer peripheral side of the second annular step 122. When the protrusion 12 is riveted to the frame 50, the first annular step 121 and the second annular step 122 are inserted into the mounting hole 5121 of the frame 50, and the inner wall of the mounting hole 5121 tightly fits with the first annular step 121 and the second annular step 122. Under pressure of the first annular step 121, the inner wall of the mounting hole 5121 deforms and extends into the inclined slot 123, thereby quickly fixing the detent cylinder 10 to the frame 50 and avoiding the detent cylinder 10 from shaking on the frame 50.

Therefore, the protrusion 12 including the first annular step 121, the second annular step 122 and opening inclined slot 123 makes it convenient to quickly fix the detent cylinder 10 to the frame 50 and prevents the detent cylinder 10 from shaking on the frame 50. This improves the convenience of installing the retention assembly 100 and the accuracy of positioning the mounting component 60 through pushing the retention ball 30 by the elastic member 40.

Figure 3:
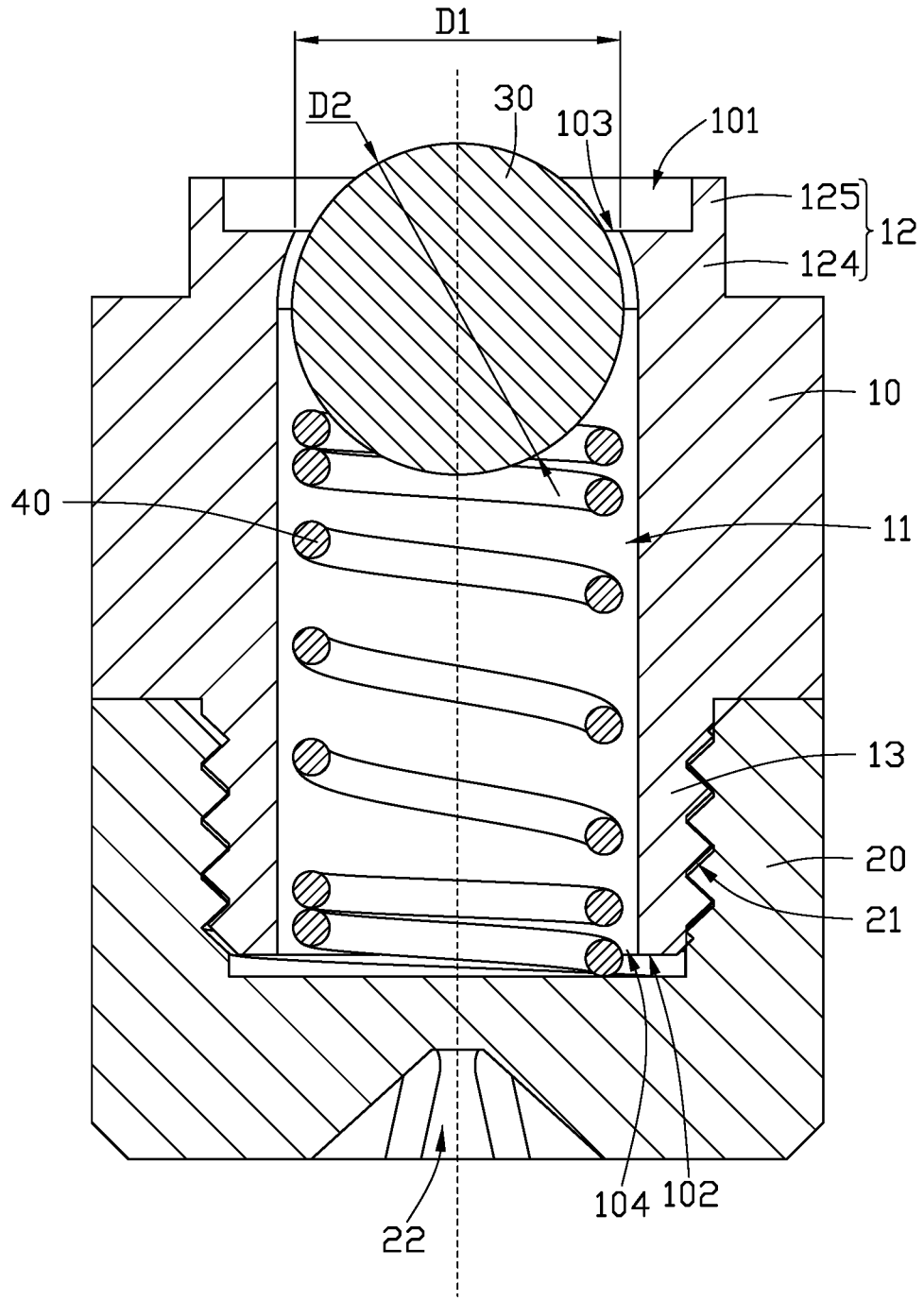
FIG. 3 is a cross section view of the retention assembly according to another embodiment.

Referring to FIG. 3 and FIG. 6, according to some embodiments, the protrusion 12 includes an insertion portion 124 and a deformation portion 125. The insertion portion 124 is protruded from the first end 101 of the detent cylinder 10, and the first opening 103 is defined in the insertion portion 124. The insertion portion 124 is used to insert into and tightly fit with the frame 50. The deformation portion 125 is located on the side of the insertion portion 124 away from the detent cylinder 10 and is arranged around the receiving hole 11. The deformation portion 125 is used to fold outward to engage with the frame 50 under external force.

Specifically, the insertion portion 124 is annular and centered with the receiving hole 11. The size of the insertion portion 124 is approximately the same as the size of the mounting hole 5121 on the frame 50. The deformation portion 125 is also annular, and the outer wall of the deformation portion 125 is flush with the outer wall of the insertion portion 124, while the thickness of the deformation portion 125 is smaller than that of the insertion portion 124. When the protrusion 12 is riveted to the frame 50, the protrusion 12 inserts into the mounting hole 5121, the insertion portion 124 tightly fits with the inner wall of the mounting hole 5121, and the deformation portion 125 passes through the mounting hole 5121 and protrudes from the mounting hole 5121. The deformation portion 125 folds outward radially by external force and presses against outer side of the mounting hole 5121, thereby quickly fixing the detent cylinder 10 to the frame 50 and preventing it from shaking on the frame 50.

Therefore, the protrusion 12 including the insertion portion 124 and the deformation portion 125 allows the deformation portion 125 to fold outward under external force, which makes it convenient to quickly fix the detent cylinder 10 to the frame 50 and prevent the detent cylinder 10 from shaking on the frame 50. This improves the convenience of installing the retention assembly 100 and the accuracy of positioning the mounting component 60 through pushing the retention ball 30 by the elastic member 40.

Referring to FIG. 2 and FIG. 4, in this embodiment, the detent cylinder 10 includes a connecting portion 13 connected to the second end 102, the second opening 104 is defined in the connecting portion 13. The cap 20 defines a blind hole 21 opened towards the second end of the detent cylinder 10. The connecting portion 13 is inserted into the blind hole 21 and movably connected to it. The elastic member 40 abuts against the bottom of the blind hole 21. The connecting portion 13 can move relative to the blind hole 21 to adjust pressure that the elastic member 40 applied on the retention ball 30.

Specifically, the connecting portion 13 is cylindrical and centered with the receiving hole 11. The connecting portion 13 is inserted into and threadedly connected to the blind hole 21. When the cap 20 is rotated, the blind hole 21 can move axially relative to the connecting portion 13, allowing the cap 20 to move closer to or away from the detent cylinder 10 to adjust the pressure that the elastic member 40 applied on the retention ball 30 according to the requirement.

According to some embodiments, multiple limiting slots are defined in the inner wall of the blind hole 21, the multiple limiting slots are spaced apart and arranged along the axial direction of the hole. The connecting portion 13 is provided with at least one bump. When the cap 20 is pushed or pulled relative to the detent cylinder 10, the connecting portion 13 and the blind hole 21 can be position relative to each other at any position as the bump may engage with any of the multiple limiting slots. The bump and the limiting slots cooperate to adjust the pressure of the elastic member 40 applied on the retention ball 30 according to the requirement. This is not limited in detail in examples of this application, and there may be set according to practical situations.

Referring to FIG. 2, according to some embodiments, the cap 20 includes an adjustment portion 22 at an end away from the detent cylinder 10. The adjustment portion 22 is used to move the blind hole 21 relative to the connecting portion 13 under external force, further improving the convenience of adjusting the compression of the elastic member 40 on the retention ball 30 according to the requirement.

According to some other embodiments, the adjustment portion 22 can be a polygonal countersink, such as a pentagonal countersink, hexagonal countersink, octagonal countersink, etc. This facilitates insertion of a screwdriver or other adjustment tool into the polygonal countersink to rotate the cap 20 to cause the blind hole 21 to move relative to the connecting portion 13, thereby improving the convenience of adjusting the pressure of the elastic member 40 applied on the retention ball 30 according to the requirement.

According to some embodiments, the adjustment portion 22 is a polygonal protrusion, making it easier to engage with a wrench or other adjustment tool and drive the cap 20 to rotate. This is not limited in detail in examples of this application, and there may be set according to practical situations.

Therefore, the retention assembly 100 including the detent cylinder 10 provided with the riveting protrusion 12 facilitates a quick fixation of the retention assembly 100 to the frame 50. By setting the retention ball 30 and the elastic member 40 in the receiving hole 11 of the detent cylinder 10, the retention ball 30 can extend into the positioning hole 611 of the mounting component 60 under the pressure of the elastic member 40, thereby positioning the mounting component 60 on the frame 50. By properly setting the position of the retention assembly 100 on the frame 50, it can effectively avoid the mounting component 60 from being too far or too close to the frame 50, thus improving the convenience of positioning the mounting component 60 relative to the frame 50. Additionally, after positioning the mounting component 60, the retention assembly 100 can prevent the mounting component 60 from sliding on the frame 50 while the electronic components mounted on the mounting component 60 are in maintenance. After completing the maintenance on the electronic components, the mounting component 60 can be quickly reset by pushing it to disengage the retention ball 30 from the positioning hole 611, thereby improving the convenience of maintenance on the electronic components mounted on the mounting component 60.

Figure 7:
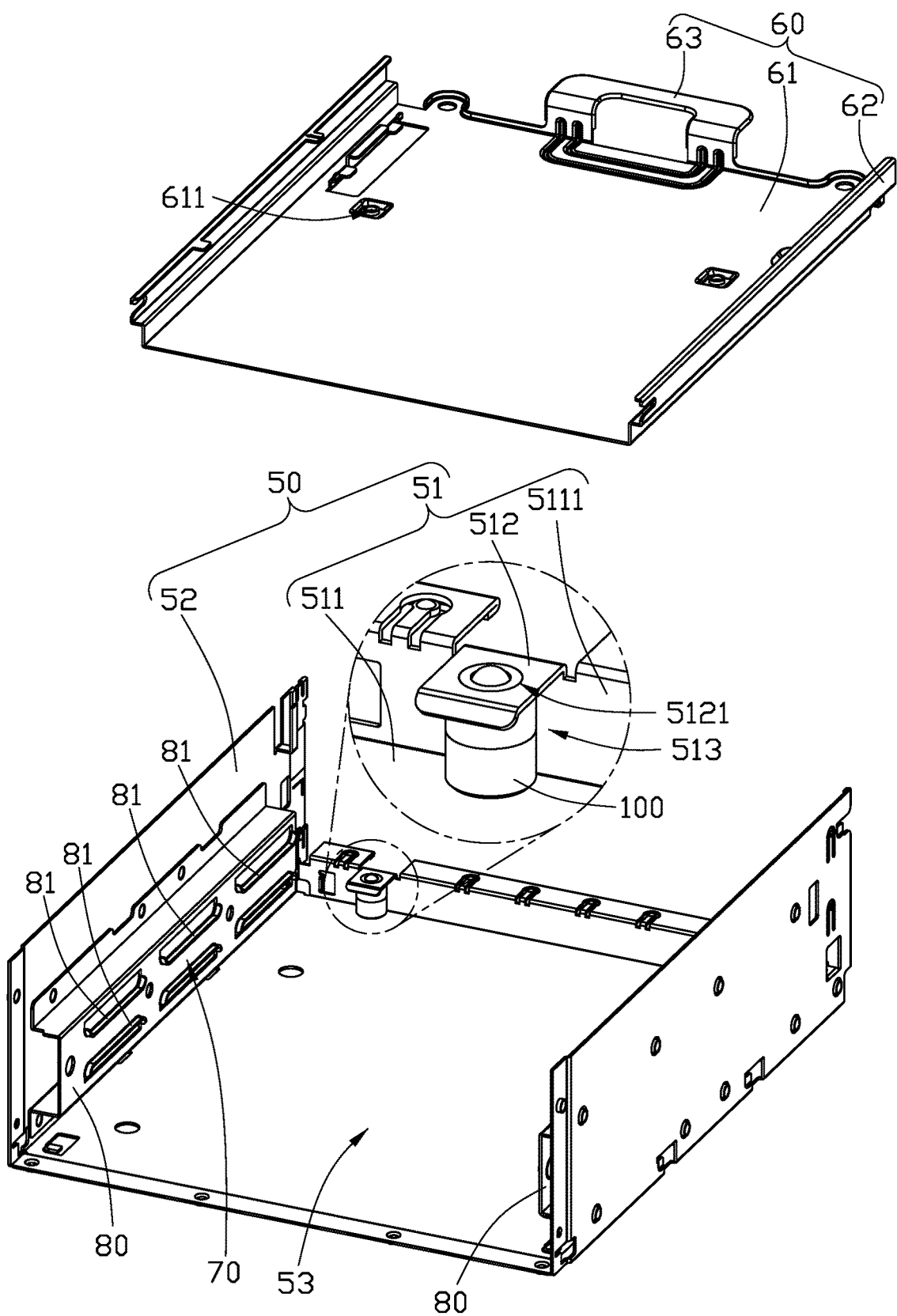
FIG. 7 is an explosive view of the chassis in FIG. 5.

Referring to FIG. 5, FIG. 6, and FIG. 7, a retention assembly 100 for positioning a mounting component slidably arranged on a frame is provided. The retention assembly 100 includes a main body 110, a retention ball 30, and an elastic member 40. The main body 110 defining a receiving cavity 120 having a first opening 103 at a first end 101 of the main body 110, the main body 110 is connected to the frame 50 at the first end 101. The retention ball 30 is received in the receiving cavity 120, a diameter D1 of the retention ball 30 is larger than a diameter D2 of the first opening 103. The elastic member 40 is located in the receiving cavity 120, the elastic member 40 is arranged between the retention ball 30 and a bottom 121 of the receiving cavity 120 for pressing the retention ball 30 towards the first opening 103, the elastic member 40 is configured for pressing the retention ball 30 to protrude from the receiving cavity 120 and insert into a positioning hole of the mounting component when the positioning hole is aligned with the retention ball 30.

Referring to FIG. 6 and FIG. 7, according to some embodiments, a chassis 200 is provided. The chassis includes the frame 50, the mounting component 60, and the retention assembly 100 as described above. The mounting component 60 is slidably mounted on the frame 50 and is used to hold electronic components. The mounting component 60 includes a positioning hole 611. The retention assembly 100 is riveted to the frame 50 through the riveting protrusion 12, and the retention ball 30 abuts against the mounting component 60. The retention assembly 100 is positioned in a movement path of the positioning hole 611, and the elastic member 40 pushes the retention ball 30 to extend into the positioning holes 611 when the retention ball 30 is aligned with the positioning hole 611, thereby positioning the mounting component 60 relative to the frame 50.

Therefore, the chassis 200 in this embodiment achieves convenient positioning of the mounting component 60 relative to the frame 50 by setting the retention assembly 100. This improves the convenience of positioning the mounting component 60 relative to the frame 50 and facilitates maintenance on the electronic components mounted on the mounting component 60.

Referring to FIG. 7, according to some embodiments, the frame 50 includes a base 51 and two support plates 52. The retention assembly 100 is riveted to the base 51 with the riveting protrusion 12. The two support plates 52 are spaced apart on the base 51, defining a sliding channel 53 therebetween. The mounting component 60 is positioned in the sliding channel 53 and is slidably connected to the two support plates 52. By slidingly connecting the mounting component 60 to the two support plates 52 of the frame 50, the mounting component 60 can slide stably on the frame 50. By riveting the retention assembly 100 to the base 51, the mounting component 60 can be positioned relative to the frame 50 conveniently by aligning with the retention assembly 100.

In this embodiment, the base 51 of the frame 50 includes a bottom plate 511 and a clamping plate 512. The bottom plate 511 is connected to the two support plates 52 and serves as a bottom of the sliding channel 53. The clamping plate 512 is located above the bottom plate 511. The riveting hole 5121 is defined in the clamping plate 512. The retention assembly 100 is positioned between the bottom plate 511 and the clamping plate 512, and the clamping plate 512 presses the retention assembly 100 onto the bottom plate 511, with the riveting protrusion 12 inserted into and riveted with the riveting holes 5121.

Specifically, the bottom plate 511 is folded at an end of the sliding channel 53 to form a folding portion 5111. The clamping plate 512 is arranged on the folding portion 5111, and an installation gap 513 is defined between the clamping plate 512 and the bottom plate 511. When riveting the retention assembly 100 to the base 51, the installation gap 513 can be enlarged by forcing the folding portion 5111 and the clamping plate 512 to deform, such that the retention assembly 100 can be placed in the installation gap 513, the cap 20 abuts the abuts against the bottom plate 511. Then the folding portion 5111 and the clamping plate 512 can be released and recover to clamp the retention assembly 100, with the riveting protrusion 12 inserting into the riveting hole 5121. Optionally, there may be two elastic clamping plates 512 and two sets of retention assemblies 100. The two elastic clamping plates 512 are spaced apart on the folding portion 5111, and each clamping plate 512 presses one of the two sets of retention assemblies 100 onto the bottom plate 511. The mounting component 60 includes two positioning holes 611. When positioning the mounting component 60 relative to the frame 50, the retention balls 30 of the two sets of retention assemblies 100 extend into the two positioning holes 611 respectively, thereby improving the stability of positioning the mounting component 60 relative to the frame 50.

Therefore, by setting the base 51 to including the bottom plate 511 and the clamping plate 512, the clamping plate 512 presses the retention assembly 100 onto the bottom plate 511 and rivets the riveting protrusion 12, facilitating the quick installation and fixation of the retention assembly 100.

According to some embodiments, the clamping plate 512 may be L-shaped. One end of the clamping plate 512 is connected to the bottom plate 511 directly, and the other end is bent and extends towards the sliding channel 53. This configuration can also achieve the effect of quick installation and fixation of the retention assembly 100. This embodiment is not intended to limit the disclosure.

Referring to FIG. 7, according to some embodiments, the frame 50 further includes a pair of slide rails 70, each of which is located on one of the support plates 52. The mounting component 60 includes a tray 61 and two sliding members 62. The tray 61 is used to carry the electronic component, and the positioning holes 611 are defined in the tray 61. The two sliding plates 62 are located on opposite sides of the tray 61 and connected to the tray 61. The two sliding plates 62 are slidably mounted on the slide rails 70, allowing the tray 61 to slide relative to the frame 50 and abut against the retention ball 30.

Specifically, each sliding plate 62 is provided with a mounting plate 80, the mounting plate 80 is provided with a pair of supporting members 81, the slide rail 70 is defined between the pair of supporting members 81. The sliding member 62 inserts into the slide rail 70, such that the tray 61 can slide along the slide rails 70 without shaking. Therefore, the mounting component 60 includes the tray 61 and the two sliding plates 62, which allows the mounting component 60 to slide on the frame 50 through the cooperation of the two sliding plates 62 and the pair of slide rails 70 and improves the stability of the mounting component 60 sliding on the frame 50.

According to some embodiments, the two sliding plates 62 are integrally formed with the tray 61 through stamping, thereby enhancing the structural strength of the tray 61.

According to some embodiments, the mounting component 60 further includes a handle 63, which is located on the tray 61. The handle 63 is used to apply external force to slide the tray 61 on the pair of slide rails 70, thereby improving the convenience of sliding the mounting component 60 for pushing and pulling.

While the disclosure has been described in detail in connection with only a limited number of embodiments, it should be readily understood for the skilled in the art that the disclosure is not limited to such disclosed embodiments. Rather, the disclosure can be modified to incorporate any number of variations, alterations, substitutions, or equivalent arrangements not heretofore described, but which are commensurate with the spirit and scope of the disclosure. Additionally, while various embodiments of the disclosure have been described, it is to be understood that aspects of the disclosure may include only some of the described embodiments. Accordingly, the disclosure is not to be seen as limited by the foregoing description but is only limited by the scope of the appended claims.

What is claimed is:

1. A retention assembly for positioning a mounting component slidably arranged on a frame, comprising:
   a detent cylinder comprising a first end and a second end opposite to the first end, wherein the first end defines a first opening, the second end defines a second opening, the detent cylinder defines a receiving hole communicates with the first opening and the second opening, and a diameter of the receiving hole gradually decreases towards the first opening, the detent cylinder is provided with a protrusion surrounding the first opening at the first end, the protrusion is configured for inserting into a mounting hole of the frame for connecting the detent cylinder to the frame;
   a cap connected to the second end of the detent cylinder for covering the second opening and enclosing the receiving hole;
   a retention ball located in the receiving hole, a diameter of the retention ball is larger than a diameter of the first opening, and
   an elastic member located in the receiving hole, the elastic member is arranged between the retention ball and the cap for pressing the retention ball towards the first opening, the elastic member is configured for pressing the retention ball to protrude from the receiving hole and insert into a positioning hole of the mounting component when the positioning hole is aligned with the retention ball.

2. The retention assembly of claim 1, wherein the protrusion is configured for inserting into the mounting hole of the frame for riveting with the frame.

3. The retention assembly of claim 2, wherein the protrusion comprises a first annular step and a second annular step, the first annular step is protruded from the first end of the detent cylinder, the second annular step is protruded from the first annular step, an inclined slot is defined between the second annular step and the first annular step, the first annular step and the second annular step are interference fit with the mounting hole of the frame, and the inclined slot is configured for engaging with the frame.

4. The retention assembly of claim 2, wherein the protrusion comprises an insertion portion and a deformation portion, the insertion portion is protruded from the first end of the detent cylinder, and the first opening is defined in the insertion portion, the insertion portion inserts into the mounting hole of the frame, the deformation portion is located on a side of the insertion portion away from the detent cylinder and is arranged around the receiving hole, the deformation portion is configured to fold outward radially to engage with the frame under an external force.

5. The retention assembly of claim 2, wherein the detent cylinder comprises a connecting portion connected to the second end, the second opening is defined in the connecting portion, the cap defines a blind hole opened towards the second end of the detent cylinder, the connecting portion is inserted into the blind hole and movably connected to the blind hole, the elastic member abuts against a bottom of the blind hole, the connecting portion moves relative to the blind hole to adjust a pressure that the elastic member applied on the retention ball.

6. The retention assembly of claim 5, wherein the cap comprises an adjustment portion at an end away from the detent cylinder, the adjustment portion is configured for being forced by an external force to move the blind hole relative to the connecting portion.

7. The retention assembly of claim 6, wherein the adjustment portion is a polygonal countersink.

8. A retention assembly for positioning a mounting component slidably arranged on a frame, comprising:
   a main body defining a receiving cavity, wherein the receiving cavity defines a first opening at a first end of the main body, the main body is provided with a protrusion surrounding the first opening at the first end, the protrusion is configured for inserting into a mounting hole of the frame for connecting the main body to the frame;
   a retention ball received in the receiving cavity, wherein a diameter of the retention ball is larger than a diameter of the first opening; and
   an elastic member located in the receiving cavity, wherein the elastic member is arranged between the retention ball and a bottom of the receiving cavity for pressing the retention ball towards the first opening, the elastic member is configured for pressing the retention ball to protrude from the receiving cavity and insert into a positioning hole of the mounting component when the positioning hole is aligned with the retention ball.

9. The retention assembly of claim 8, wherein the protrusion is configured for inserting into the mounting hole of the frame for riveting with the frame.

10. The retention assembly of claim 9, wherein the protrusion comprises a first annular step and a second annular step, the first annular step is protruded from the first end of the detent cylinder, the second annular step is protruded from the first annular step, an inclined slot is defined between the second annular step and the first annular step, the first annular step and the main body are interference fit with the mounting hole of the frame, and the inclined slot is configured for engaging with the frame.

11. The retention assembly of claim 9, wherein the protrusion comprises an insertion portion and a deformation portion, the insertion portion is protruded from the first end of the main body, and the first opening is defined in the insertion portion, the insertion portion inserts into the mounting hole of the frame, the deformation portion is located on a side of the insertion portion away from the main body and is arranged around the receiving hole, the deformation portion is configured to fold outward radially to engage with the frame under an external force.

\* \* \* \* \*